United States Patent

Nara et al.

Patent Number: 5,850,279
Date of Patent: Dec. 15, 1998

[54] ALIGNMENT METHOD, PROJECTION EXPOSURE METHOD, AND PROJECTION EXPOSURE APPARATUS

[75] Inventors: Kei Nara; Masaki Kato; Kinya Kato, all of Yokohama; Tsuyoshi Narabe, Omiya, all of Japan

[73] Assignee: Nikon Corporation, Tokyo, Japan

[21] Appl. No.: 619,981

[22] Filed: Mar. 20, 1996

[30] Foreign Application Priority Data

Mar. 23, 1995 [JP] Japan ................................... 7-090349

[51] Int. Cl.$^6$ ............................ G03B 27/42; G01B 11/00
[52] U.S. Cl. ................................ 355/53; 355/55; 355/67; 356/399; 356/400; 356/401
[58] Field of Search .............................. 355/53; 356/399, 356/400, 401; 250/201.1, 559.3

[56] References Cited

U.S. PATENT DOCUMENTS

| | | |
|---|---|---|
| 4,269,505 | 5/1981 | Mayer . |
| 4,780,616 | 10/1988 | Nishi et al. . |
| 5,138,176 | 8/1992 | Nishi ...................................... 250/548 |
| 5,168,306 | 12/1992 | Morimoto et al. ........................ 355/53 |
| 5,243,195 | 9/1993 | Nishi ...................................... 250/548 |
| 5,309,197 | 5/1994 | Mori et al. ................................ 355/53 |
| 5,481,362 | 1/1996 | Van Den Brink et al. ............. 356/401 |
| 5,602,644 | 2/1997 | Ota .......................................... 356/363 |

FOREIGN PATENT DOCUMENTS 4-45512  2/1992  Japan .

Primary Examiner—R. L. Moses
Assistant Examiner—Shival Virmani
Attorney, Agent, or Firm—Oliff & Berridge, PLC

[57] ABSTRACT

Disclosed is a projection exposure method for transferring a pattern formed on a mask onto a photosensitive substrate through a projection optical system. A light beam having a first wavelength for exposure is radiated through the projection optical system onto a first mark area including a fiducial mark on a fiducial plate installed on a substrate stage, reflected light from the first mark area is detected to obtain a position of the fiducial mark. A light beam having a second wavelength to which the photosensitive substrate is not photosensitive is radiated through the projection optical system onto the first mark area, reflected light from the first mark area is detected to obtain a position of the fiducial mark. A positional discrepancy of the fiducial mark caused by the difference in wavelength between the first and second wavelengths is previously calculated on the basis of results of the detection. The light beam having the second wavelength is radiated through the projection optical system onto an alignment mark on the photosensitive substrate, reflected light therefrom is detected to obtain a position of the photosensitive substrate under the light beam having the second wavelength. A positional discrepancy of the photosensitive substrate is corrected on the basis of a result of the detection and the calculation, and thus positional alignment for the photosensitive substrate is performed, followed by actual exposure.

29 Claims, 7 Drawing Sheets

PRIOR ART

Fig.9

PRIOR ART

ALIGNMENT METHOD, PROJECTION EXPOSURE METHOD, AND PROJECTION EXPOSURE APPARATUS

BACKGROUND OF THE INVENTION

1. Field of the Invention

The present invention relates to a projection exposure method for producing liquid crystal substrates, and an alignment method for a photosensitive substrate as well as a projection exposure apparatus used for carrying out the projection exposure method. In particular, the present invention relates to an alignment method for a photosensitive substrate or for a mask and a photosensitive substrate, a projection exposure method, and a projection exposure apparatus which use a light beam having a second wavelength characteristic different from a light beam having a first wavelength characteristic used for exposure.

2. Description of the Related Art

Conventional projection exposure apparatuses such as exposure apparatuses for liquid crystal devices use a light beam having a relatively short wavelength as an exposure light (light having a first wavelength characteristic) in order to obtain a high resolution. The light beam is limited to a monochromatic or narrow wavelength region so as to decrease the influence of aberration of a projection optical system as small as possible. On the other hand, an alignment light beam is used for positional adjustment (alignment) for a photosensitive substrate and a mask, for which it is necessary to use a light beam having a relatively long wavelength (light beam having a second wavelength characteristic) so that a resist layer applied on a surface of the photosensitive substrate is not photosensitive to the alignment light beam.

Figure 8:
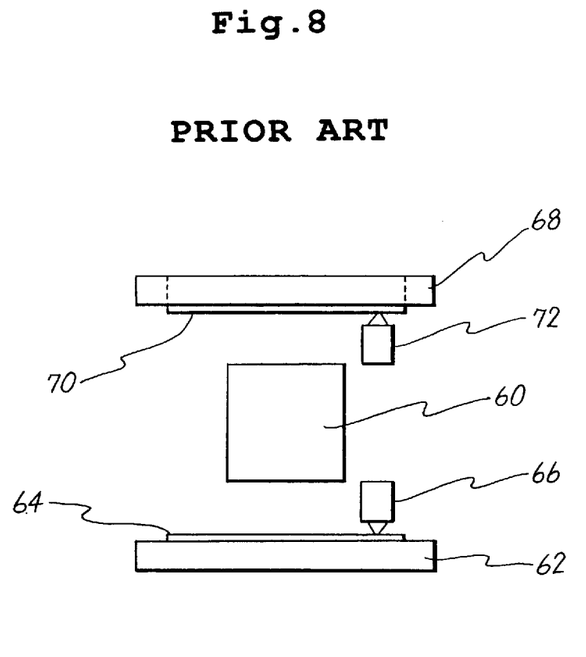
FIG. 8 shows a conceptual view illustrating a conventional Projection exposure apparatus provided with an alignment system of the off-axis system.

In such circumstances, it has been difficult, due to problems such as chromatic aberration, to design an optical system which works as not only a projection optical system but also an alignment optical system. Therefore, an arrangement of the off-axis system as shown in FIG. 8 has been generally adopted in many cases for conventional exposure apparatuses for manufacturing liquid crystal devices. This arrangement includes a projection optical system 60, an alignment optical system 66 for detecting a position of a photosensitive substrate 64 such as a glass substrate placed on a plate holder 62, and an alignment optical system 72 for detecting a position of a mask 70 held on a mask holder 68. In this arrangement, the alignment optical systems 66, 72 are provided separately from the projection optical system 60.

Figure 9:
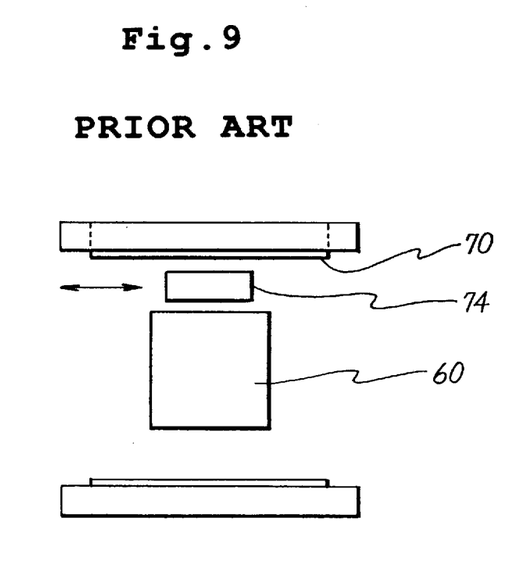
FIG. 9 shows a conceptual view illustrating a conventional projection exposure apparatus provided with an alignment system of the TTL system.

Another apparatus is also known as shown in FIG. 9, which uses an alignment system of the TTL (Through The Lens) system for directly detecting a position of a mark through a projection optical system. Even in the case of such an apparatus, an arrangement is adopted in which a correcting optical system 74 for correcting aberration of the projection optical system 60 generated by using an alignment wavelength is provided between a projection optical system 60 and a mask 70, the correcting optical system 74 being movable in a direction perpendicular to an optical axis of the projection optical system 60. Upon alignment, the correcting optical system 74 is moved onto the optical axis of the projection optical system 60 in order to correct the influence of aberration of the projection optical system 60 resulting from the difference between the alignment wavelength and an exposure wavelength.

However, the exposure apparatus, which adopts the arrangement of the off-axis system as shown in FIG. 8, has had an inconvenience that the alignment accuracy is low due to the influence of Abbe error as compared with the TTL system for directly detecting the mark position through the projection optical system, because the alignment optical systems are arranged at positions spaced apart from the projection optical system (positions different from an exposure position).

On the other hand, the exposure apparatus, which adopts the correcting optical system as shown in FIG. 9, has had an inconvenience that the apparatus necessarily involves an error caused by the correcting optical system itself upon the actual use, although the improvement in alignment accuracy can be expected owing to the TTL system, resulting in that enough alignment accuracy cannot be assured.

SUMMARY OF THE INVENTION

The present invention has been achieved considering the inconveniences possessed by the conventional art as described above, an object of which is to provide an alignment method which enables alignment for a photosensitive substrate at high accuracy by using the TTL system without using a correcting optical system for an alignment light beam or the like, as well as provide a projection exposure method and a projection exposure apparatus using the alignment method.

According to a first aspect of the present invention, there is provided an alignment method, for aligning a photosensitive substrate, to be used for transferring a pattern formed on a mask onto the photosensitive substrate through a projection optical system, comprising:

a first step of radiating a light beam having a first wavelength characteristic through the projection optical system onto a first mark area including a fiducial mark installed at the same position as that of the photosensitive substrate in a direction of an optical axis of the projection optical system, and detecting optical information from the first mark area to obtain a position of the fiducial mark under the light beam having the first wavelength characteristic;

a second step of radiating a light beam having a second wavelength characteristic different from the first wavelength characteristic through the projection optical system onto the first mark area, and detecting optical information from the first mark area to obtain a position of the fiducial mark under the light beam having the second wavelength characteristic;

a third step of calculating a positional discrepancy of the fiducial mark caused by the difference in wavelength between the light beam having the first wavelength characteristic and the light beam having the second wavelength characteristic on the basis of results of the detection in the first and second steps;

a fourth step of radiating the light beam having the second wavelength characteristic through the projection optical system onto a second mark area including an alignment mark on the photosensitive substrate, and detecting optical information from the second mark area to obtain a position of the photosensitive substrate under the light beam having the second wavelength characteristic; and a fifth step of correcting a positional discrepancy of the photosensitive substrate on the basis of a result of the detection in the fourth step and a result of the calculation in the third step.

According to the present invention, alignment is performed as follows under the light beam having the first wavelength characteristic which is used as an exposure light beam, and the light beam having the second wavelength characteristic to which the photosensitive substrate is not photosensitive. Namely, for example, positions of an identical fiducial mark formed on a fiducial plate installed on a substrate stage are photoelectrically detected through the projection optical system under the two light beams respectively. A positional error of the fiducial mark caused by the difference in wavelength characteristic is previously determined by calculation on the basis of results of the detection. Upon actual alignment, a position of an alignment mark on a photosensitive substrate is photoelectrically detected by using the light beam having the second wavelength characteristic, and thus a final correction amount for a positional discrepancy of the photosensitive substrate is determined on the basis of a result of this detection and the positional error of the fiducial mark calculated as described above. Therefore, it is unnecessary to provide a correcting optical system or the like for the projection optical system if the fiducial mark on the substrate stage and the alignment mark on the photosensitive substrate are available according to the invention. Thus a precise correction amount for a positional discrepancy of the photosensitive substrate can be determined under the TTL system, on the basis of which the photosensitive substrate can be precisely aligned.

According to a second aspect of the present invention, there is provided a projection exposure method comprising the alignment method of the present invention as described above.

According to a third aspect of the present invention, there is provided an alignment method, for aligning a mask and a photosensitive substrate, to be used for transferring a pattern formed on the mask onto the photosensitive substrate through a projection optical system, comprising:

a first step of radiating a light beam having a first wavelength characteristic onto a first mark area including a first fiducial mark formed on the mask or at the same position as that of the mask in a direction of an optical axis of the projection optical system, radiating the light beam having the first wavelength characteristic through the projection optical system onto a second mark area including a second fiducial mark installed at the same position as that of the photosensitive substrate in the direction of the optical axis of the projection optical system and corresponding to the first fiducial mark, and detecting optical information from the first and second mark areas to obtain detecting a correlative positional discrepancy between the first and second fiducial marks under the light beam having the first wavelength characteristic;

a second step of radiating a light beam having a second wavelength characteristic different from the first wavelength characteristic onto the first mark area, radiating the light beam having the second wavelength characteristic through the projection optical system onto the second mark area, detecting optical information from the first and second mark areas, and thus detecting a correlative positional discrepancy between the first and second fiducial marks under the light beam having the second wavelength characteristic;

a third step of calculating a difference between the positional discrepancies caused by the difference in wavelength between the light beam having the first wavelength characteristic and the light beam having the second wavelength characteristic on the basis of results of the detection in the first and second steps;

a fourth step of radiating the light beam having the second wavelength characteristic onto the first mark area, radiating the light beam having the second wavelength characteristic through the projection optical system onto an alignment mark on the photosensitive substrate, and detecting optical information from the first mark area and the alignment mark on the photosensitive substrate to obtain a positional discrepancy between the mask and the photosensitive substrate under the light beam having the second wavelength characteristic; and a fifth step of correcting the positional discrepancy between the mask and the photosensitive substrate on the basis of a result of the detection in the fourth step and a result of the calculation in the third step to perform positional alignment for the mask and the photosensitive substrate.

According to the alignment method in accordance with the third aspect of the present invention, the first fiducial mark formed on the mask or, for example, on a mask stage and the second fiducial mark on a substrate stage are photoelectrically detected through the projection optical system respectively under the light beam having the first wavelength characteristic which is used for exposure, and the light beam having the second wavelength characteristic with which the photosensitive substrate is not exposed. Thus correlative positional discrepancies between the first and second fiducial marks are obtained under the light beams having the first and second wavelength characteristics respectively. A difference between the correlative positional discrepancies between the first and second fiducial marks caused by the difference in wavelength characteristic is previously determined by calculation on the basis of results of the detection under the two light beams. Upon actual alignment, the light beam having the second wavelength characteristic is used to detect a positional discrepancy between the mask and the photosensitive substrate under the light beam having the second wavelength characteristic, and thus a correction amount for alignment for the mask and the photosensitive substrate is determined on the basis of a result of this detection and the difference between the positional discrepancies calculated as described above. Therefore, it is unnecessary to provide a correcting optical system or the like for the projection optical system provided that the first fiducial mark on the mask stage or the mask, the second fiducial mark on the substrate stage, and the alignment mark on the photosensitive substrate are available according to the invention. Thus a precise correction amount for alignment for the mask and the photosensitive substrate can be determined under the TTL system, on the basis of which the mask and the photosensitive substrate can be precisely aligned.

According to a fourth aspect of the present invention, there is provided a projection exposure method comprising the alignment method in accordance with the third aspect as described above.

According to a fifth aspect of the present invention, there is provided a projection exposure apparatus for transferring a pattern formed on a mask onto a photosensitive substrate through a projection optical system, comprising:

a mask stage for placing the mask thereon;

a photosensitive substrate stage, provided with a fiducial plate, for placing the photosensitive substrate thereon;

a first illuminating means for radiating a light beam having a first wavelength characteristic through the projection optical system onto a first mark area including a fiducial mark formed on the fiducial plate;

a first detecting means for detecting optical information from the first mark area to obtain a position of the fiducial mark under the light beam having the first wavelength characteristic;

a second illuminating means for radiating a light beam having an optical axis common to an optical axis of the light beam from the first illuminating means and having a second wavelength characteristic different from the first wavelength characteristic through the projection optical system onto the first mark area;

a second detecting means for detecting optical information from the first mark area to obtain a position of the fiducial mark under the light beam having the second wavelength characteristic; and a calculating means for calculating a positional discrepancy of the fiducial mark caused by the difference in wavelength between the light beam having the first wavelength characteristic and the light beam having the second wavelength characteristic on the basis of results of the detection by the first and second detecting means;

whereby positional alignment for the photosensitive substrate is performed prior to actual exposure on the basis of the positional discrepancy calculated by the calculating means.

According to the use of the projection exposure apparatus of the present invention, upon actual alignment, a correction amount for a positional discrepancy of the photosensitive substrate is determined on the basis of an offset and a position of an alignment mark detected under the light beam having the second wavelength characteristic. Accordingly, the photosensitive substrate can be precisely aligned.

According to a sixth aspect of the present invention, there is provided a projection exposure apparatus for transferring a pattern formed on a mask onto a photosensitive substrate through a projection optical system, comprising:

a mask stage for placing the mask thereon;

a photosensitive substrate stage, provided with a fiducial plate, for placing the photosensitive substrate;

a first illuminating means for radiating a light beam having a first wavelength characteristic onto a first mark area including a first fiducial mark formed on the mask or the mask stage, and radiating the light beam having the first wavelength characteristic through the projection optical system onto a second mark area including a second fiducial mark formed on the fiducial plate, the second fiducial mark corresponding to the first fiducial mark;

a first detecting means for detecting optical information from the first and second mark areas to obtain a correlative positional discrepancy between the first and second fiducial marks under the light beam having the first wavelength characteristic;

a second illuminating means, provided with an optical axis common to an optical axis of the first illuminating means, for radiating a light beam having a second wavelength characteristic different from the first wavelength characteristic onto the first mark area, and radiating the light beam having the second wavelength characteristic through the projection optical system onto the second mark area;

a second detecting means for detecting optical information from the first and second mark areas to obtain a correlative positional discrepancy between the first and second fiducial marks under the light beam having the second wavelength characteristic; and a calculating means for calculating a difference between the positional discrepancies caused by the difference in wavelength between the light beam having the first wavelength characteristic and the light beam having the second wavelength characteristic on the basis of results of the detection by the first and second detecting means;

whereby relative positional alignment for the mask and the photosensitive substrate is performed prior to actual exposure on the basis of the difference between the positional discrepancies calculated by the calculating means.

According to the projection exposure apparatus in accordance with the sixth aspect, upon actual alignment, a positional discrepancy between the mask and the photosensitive substrate is detected under the light beam having the second wavelength characteristic. A correction amount for alignment for the mask and the photosensitive substrate is determined on the basis of a result of the detection and an offset. Accordingly, the mask and the photosensitive substrate can be subjected to precise positional alignment.

In the projection exposure apparatus of the present invention, the first and second detecting means can be constructed by an identical device which is capable of detecting the correlative positional discrepancy between the first and second fiducial marks under the light beam having any one of the first and second wavelength characteristics. Accordingly, the arrangement of the apparatus is simplified, and the entire apparatus can be miniaturized.

In the projection exposure apparatus of the present invention, the first and second illuminating means can be constructed by an identical device comprising a single light source, and a wavelength-selecting means for selectively transmitting a light beam from the light source depending on its wavelength characteristic, selectively radiating the light beam having the first or second wavelength characteristic onto the mask stage or the mask, and selectively radiating the light beam having the first or second wavelength characteristic through the projection optical system onto the substrate stage. Accordingly, the number of parts is reduced, and thus the apparatus can be miniaturized.

DETAILED DESCRIPTION OF PREFERRED EMBODIMENTS

Figure 1:
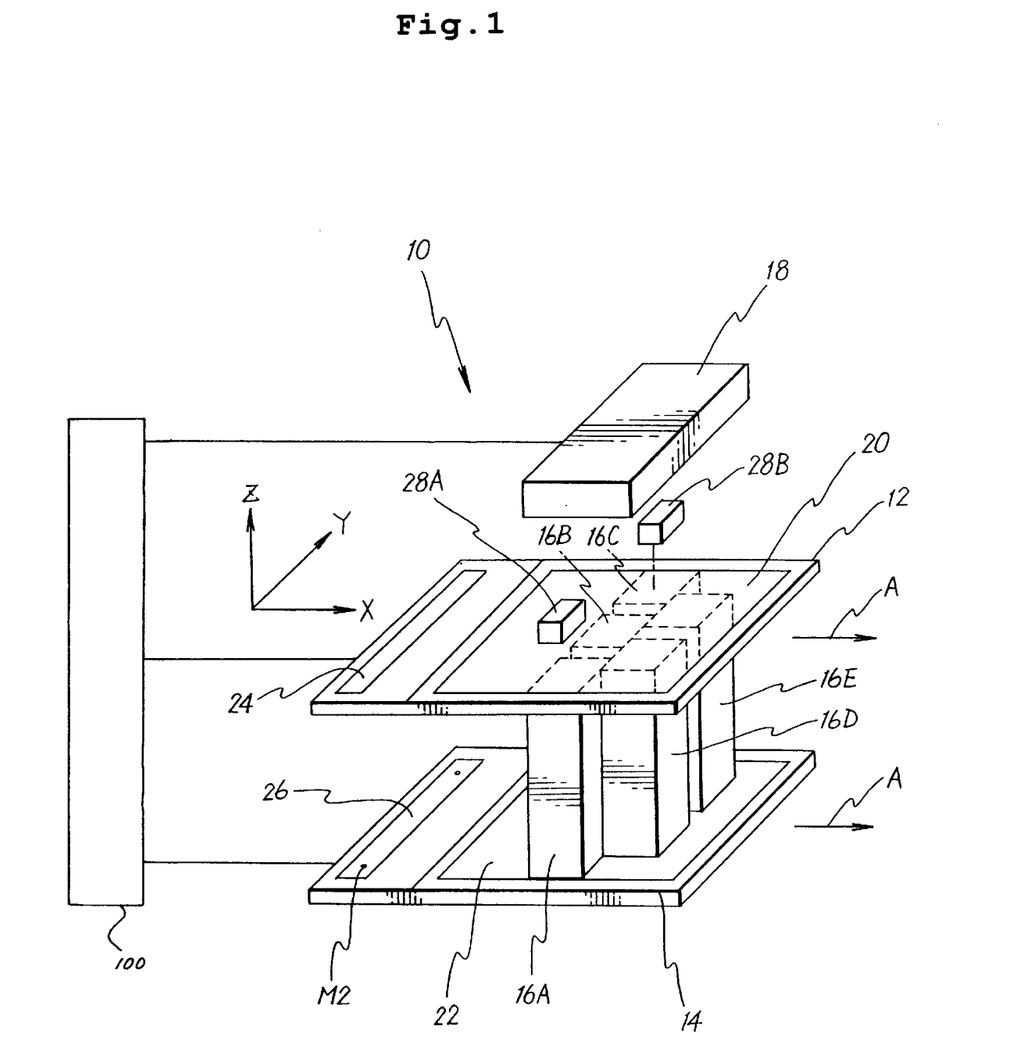
FIG. 1 shows a perspective view illustrating a schematic arrangement of an embodiment of a full-plate scanning type exposure apparatus for liquid crystal devices according to the present invention.

One embodiment of the present invention will be explained below with reference to FIGS. 1 to 5. FIG. 1 shows a schematic arrangement of a full-plate scanning type exposure apparatus 10 as a projection exposure apparatus of this embodiment to which an alignment apparatus according to the present invention is applied. The full-plate scanning type exposure apparatus means a projection exposure apparatus in which entire field of photosensitive substrate is exposed with a mask pattern by one scanning.

This exposure apparatus 10 comprises a mask holder 12 as a mask stage arranged along a horizontal plane (XY plane), a plate holder 14 as a substrate stage arranged to oppose to the mask holder 12 and spaced apart from the mask holder 12 by a predetermined spacing distance downwardly in a direction of the Z axis, a plurality (five in this embodiment) of projection optical systems 16A, 16B, 16C, 16D, 16E arranged correlatively between the holder 12 and holder 14, and an illumination optical system for exposure 18 for illuminating a rectangular area which embraces all XY cross-sections of the projection optical systems 16A to 16E.

A rectangular mask 20 is placed on the mask holder 12. A rectangular glass substrate 22 as a photosensitive substrate (hereinafter referred to as "plate") corresponding to the mask 20 is placed on the plate holder 14. The mask holder 12 and the plate holder 14 are actually coupled to each other by an unillustrated carriage having a ]-shaped cross-section (cross-section like a shape of channel) so that they are integrally movable along a direction of the X axis in accordance with movement of the carriage in this arrangement. The plate holder 14 is finely movable in X, Y directions on an unillustrated stage of the carriage, and its position is finely adjusted by a control unit 100 through an unillustrated driving system. The carriage is also controlled and driven by the control unit 100.

A first fiducial mark plate 24 is provided at one end (left end in FIG. 1) of the mask holder 12, and it extends in a direction of the Y axis. A second fiducial mark plate 26 corresponding to the first fiducial mark plate 24 is provided at one end (left end in FIG. 1) of the plate holder 14, and it extends in the direction of the Y axis. Fiducial marks are formed on these fiducial mark plates respectively, however, they will be described later on.

The five projection optical systems 16A, 16B, 16C, 16D, 16E have their respective optical axes which are arranged in the direction of the Z axis perpendicular to the XY plane. Among them, the projection optical systems 16A, 16B, 16C are arranged along the direction of the Y axis and spaced apart by a predetermined spacing distance. The residual projection optical system 16D, 16E are arranged adjacent to the projection optical systems 16A, 16B, 16C with a little rightward deviation along the direction of the Y axis and spaced apart by a predetermined spacing distance. Namely, in this embodiment, the five projection optical systems 16A, 16B, 16C, 16D, 16E are arranged in a so-called zigzag configuration so as to construct an array of the projection optical systems. Accordingly, in this arrangement, when the mask holder 12 and the plate holder 14 are integrally scanned in the direction of the X axis, entire surfaces of the mask 20 and the plate 22 can be exhaustively covered with image fields (projection areas) of the five projection optical systems.

Alignment optical systems 28A, 28B are arranged over the outermost projection optical systems 16A, 16C.

Figure 2:
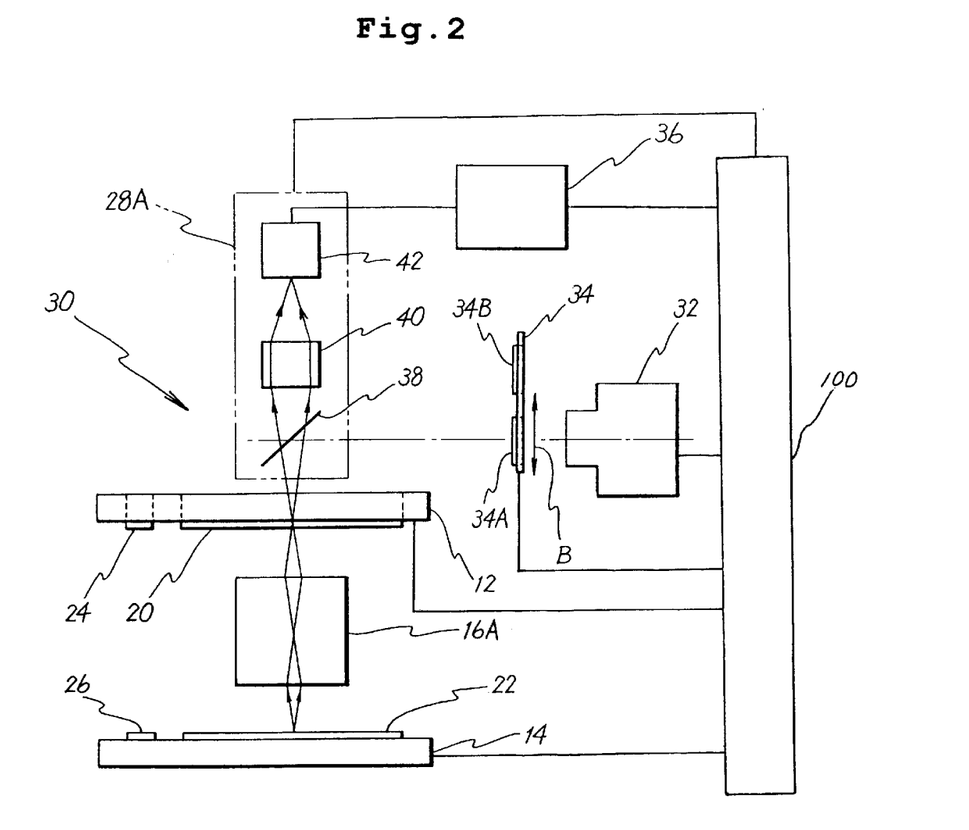
FIG. 2 shows an arrangement of an alignment apparatus as a principal part of the apparatus shown in FIG. 1.

FIG. 2 shows an arrangement of an alignment apparatus 30 including one alignment optical system 28A, the alignment apparatus 30 constituting a principal part of the exposure apparatus 10. Now the arrangement of the alignment apparatus 30 will be described in detail below.

The alignment apparatus 30 comprises a light source for alignment 32, an optical filter unit 34 as a wavelength-selecting means, the alignment optical system 28A, and an image processing unit 36. A high-voltage mercury lamp is used as the light source 32.

Figure 3:
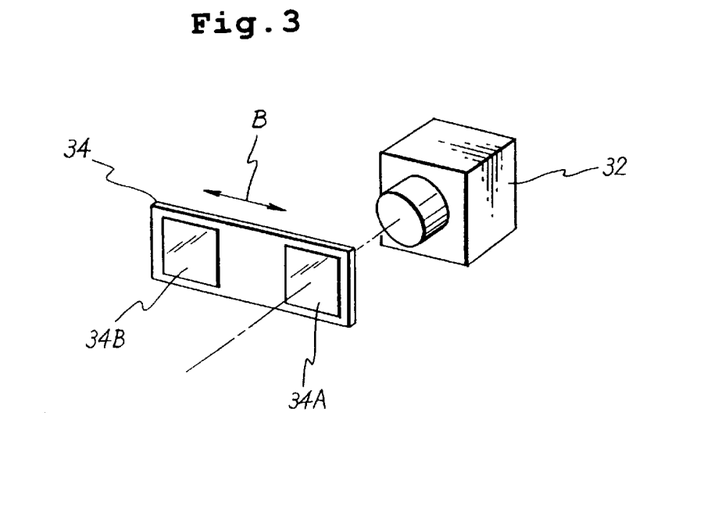
FIG. 3 shows a perspective view illustrating an optical filter unit shown in FIG. 2 together with a light source.

As shown in FIG. 3, the optical filter unit 34 comprises a first optical filter 34A for selectively transmitting only an alignment light beam (for example, e-ray or d-ray) as the light beam having the second wavelength characteristic, and a second optical filter 34B for selectively transmitting only an exposure light beam (for example, g-ray or h-ray) as the light beam having the first wavelength characteristic. These optical filters 34A, 34B are driven by an unillustrated driving system along directions across an optical axis of the light source 32 as shown by an arrow B in FIG. 3. Accordingly, the exposure light beam and the alignment light beam are selectively radiated onto the mask 20 and the projection optical system 16A while the beams are bent by a half mirror 38 as described later on. Namely, in this embodiment, the light source 32, the optical filter unit 34, and the half mirror 38 constitute a first illuminating means for radiating a light beam having a first wavelength characteristic (exposure light beam) onto a first mark area including a first fiducial mark M1 (described later on) formed on the mask 20 or a first fiducial plate 24, and radiating the light beam having the first wavelength characteristic through the projection optical system 16A onto a second mark area including a second fiducial mark M2 (described later on) formed on a second fiducial plate 26. The light source 32, the optical filter unit 34, and the half mirror 38 also constitute a second illuminating means for radiating a light beam having an optical axis common to an optical axis of the exposure light beam from the first illuminating means and having a second wavelength characteristic (alignment light beam) onto the first mark area, and radiating the light beam having the second wavelength characteristic through the projection optical system 16A onto the second mark area.

Figure 4A:
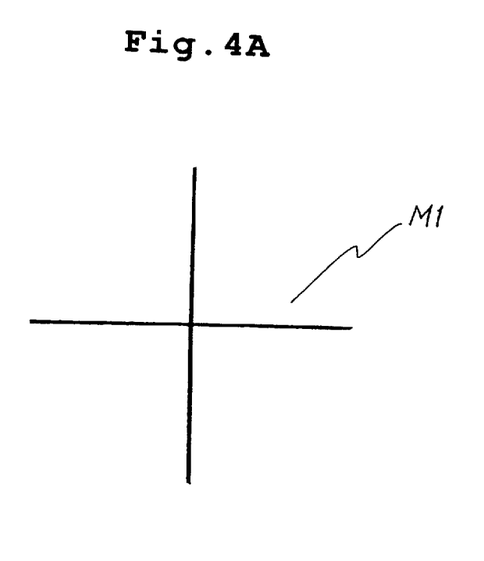
FIG. 4A shows a plan view illustrating a first fiducial mark M1 formed on a first fiducial plate.

An upper surface of the plate 22 and a lower surface (pattern plane) of the mask 20 are conjugate with respect to the projection optical system 16A. A lower surface of the first fiducial plate 24 described above has substantially the same height as that of the pattern plane of the mask 20. The first fiducial plate 24 includes a first fiducial mark M1 thereon being a cross-shaped mark as shown in FIG. 4A which is formed at a position capable of being detected by the alignment optical system 28A. The same mark M1 is also formed on the mask 20 for the use for alignment.

Figure 4B:
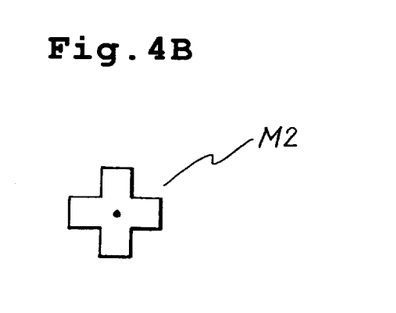
FIG. 4B shows a plan view illustrating a second fiducial mark M2 formed on a second fiducial plate.

An upper surface of the second fiducial plate 26 described above also has substantially the same height as that of the upper surface of the plate 22. The second fiducial plate 26 includes a second fiducial mark M2 thereon being a blanked cross-shaped mark as shown in FIG. 4B which is formed at a position capable of being detected by the alignment optical system 28A through the projection optical system 16A. An alignment mark M2 having the same shape is also formed on the plate 22.

With regard to the projection optical system 16A, it is desired to use those having small chromatic aberration. This embodiment uses a projection optical system of the so-called Dyson type or the Oftner type. The projection optical system 16A used herein is a projection optical system having such a feature that an image transferred onto the plate 22 is an erected image with respect to a pattern on the mask 20. The projection optical system 16A is made achromatic with respect to g-ray to h-ray emitted from the light source 32. The other projection optical systems 16B, 16C, 16D, 16E also have the same feature.

The alignment optical system 28A comprises the half mirror 38, an objective lens 40, and a CCD camera 42. The objective lens 40 has its optical axis which is coincident with the optical axis of the projection optical system 16A so that an image of the mark M1 on the mask 20 and an image of the alignment mark M2 on the plate 22 are formed on a light-receiving plane of the CCD camera 42 through the objective lens 40 in this arrangement. In the same manner as described above, an image of the first fiducial mark M1 on the first fiducial plate 24 and an image of the second fiducial mark M2 on the second fiducial plate 26, which are conjugate with each other with respect to the projection optical system 16A, are formed on the light-receiving plane of the CCD camera 42 through the objective lens 40.

Image information from the CCD camera 42 is outputted to the image processing unit 36. The image processing unit 36 detects a relative discrepancy amount between the mask 20 and the plate 22 on the basis of the image information as described later on.

The alignment optical system 28A is movable in this arrangement so that it does not enter an illumination range of the illumination system 18 during an exposure operation. Movement of the alignment optical system 28A is also controlled by the control unit 100.

Another alignment apparatus principally comprising the other alignment optical system 28B has the same arrangement as that of the alignment apparatus 30 described above. In the same manner as described above, marks M1 are provided on the mask 20 and the first fiducial plate 24 at positions capable of being detected by the alignment optical system 28B, and marks M2 are provided on the plate 22 and the second fiducial plate 26 at positions capable of being detected by the alignment optical system 28B through the projection optical system 16C.

Next, an operation of the exposure apparatus 10 constructed as described above will be explained.

Prior to exposure, the control unit 100 drives the carriage having the ]-shaped cross-section to move the plate holder 12 and the mask holder 14 in a direction of an arrow A in FIG. 1 so that the pair of first fiducial marks M1 on the first fiducial plate 24 and the pair of second fiducial marks M2 on the second fiducial plate 26 are conjugate with each other with respect to the projection optical systems 16A, 16C, and they are located within the image fields of the alignment optical systems 28A, 28B respectively.

Next, the control unit 100 drives the optical filter unit 34 to make setting so that the second optical filter 34B for the exposure light beam is located on the optical axis of the light source 32. After that, the light source 32 is turned ON. Accordingly, the exposure light beam emitted from the light source 32 is transmitted through the second optical filter 34B, and it is bent by the half mirror 38 so that the first mark area including the first fiducial mark M1 on the first fiducial plate 24 is irradiated therewith, and the second mark area including the second fiducial mark M2 on the second fiducial plate 26 is irradiated therewith through the projection optical system 16A. Images of the first fiducial mark M1 and the second fiducial mark M2 are formed on the light-receiving plane of the CCD camera 42 through the objective lens 40. The same operation is also conducted in the other alignment apparatus principally comprising the alignment optical system 28B. Images of the first fiducial mark M1 and the second fiducial mark M2 are formed on the light-receiving plane of the CCD camera 42 through the objective lens 40 in the same manner as described above.

Figure 5A:
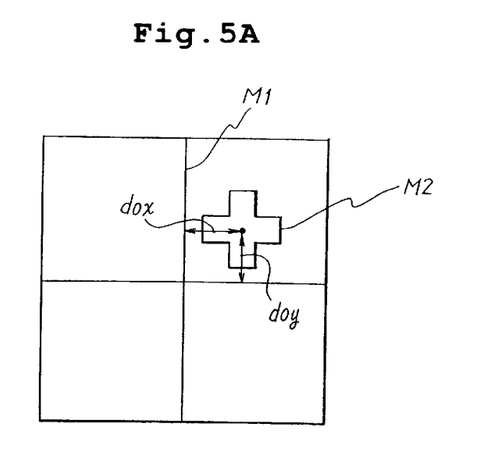
FIG. 5A shows an image obtained by monitoring images of the fiducial marks M1 and M2 illuminated with an exposure light beam by using a CCD camera.

FIG. 5A shows an example of an image projected on a monitor screen, comprising the images of the first fiducial mark M1 and the second fiducial mark M2 formed by the image formation on the light-receiving plane of the CCD camera 42 at this time. Image information corresponding to this image is sent to the image processing unit 36. The image processing unit 36 detects an image discrepancy amount ($d_{0x}$, $d_{0y}$) between the fiducial marks M1 and M2. The discrepancy amount ($d_{0x}$, $d_{0y}$) is stored in an internal memory.

Next, the control unit 100 drives the optical filter unit 34 to make setting so that the first optical filter 34A for the alignment light beam is located on the optical axis of the light source 32. Accordingly, the alignment light beam emitted from the light source 32 is bent by the half mirror 38 so that the first mark area on the first fiducial plate 24 is irradiated therewith, and the second mark area on the second fiducial plate 26 is irradiated therewith through the projection optical system 16A. Images of the first fiducial mark M1 and the second fiducial mark M2 are formed on the light-receiving plane of the CCD camera 42 through the objective lens 40. The same operation is also conducted in the other alignment apparatus principally comprising the alignment optical system 28B. Images of the first fiducial mark M1 and the second fiducial mark M2 are formed on the light-receiving plane of the CCD camera 42 through the objective lens 40 in the same manner as described above.

Figure 5B:
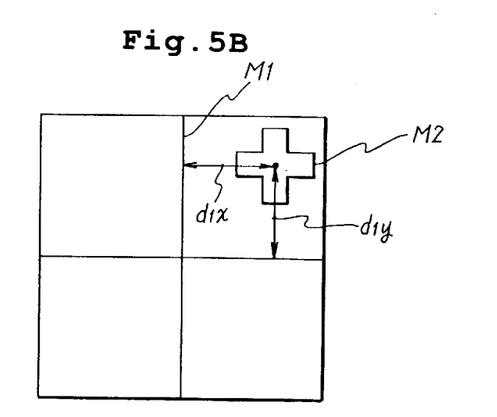
FIG. 5B shows an image obtained by monitoring images of the fiducial marks M1 and M2 illuminated with an alignment light beam by using a CCD camera.

FIG. 5B shows an example of an image projected on the monitor screen, comprising the images of the first fiducial mark M1 and the second fiducial mark M2 formed by the image formation on the light-receiving plane of the CCD camera 42 at this time. Image information corresponding to this image is sent to the image processing unit 36. The image processing unit 36 detects a discrepancy amount ($d_{1x}$, $d_{1y}$) between the fiducial marks M1 and M2. The discrepancy amount ($d_{1x}$, $d_{1y}$) is stored in the internal memory.

These discrepancy amounts contain errors upon production of the respective marks (fiducial marks) and errors caused by aberration of the projection optical system depending on the wavelength of the light beam used for the measurement.

Accordingly, the image processing unit 36 calculates a correction value ($\Delta dx$, $\Delta dy$) for the use of the alignment light beam instead of the exposure light beam on the basis of the following expressions (1) and (2). The correction value ($\Delta dx$, $\Delta dy$) is stored as an offset amount in the internal memory.

$$\Delta dx = d_{0x} - d_{1x} \tag{1}$$

$$\Delta dy = d_{0y} - d_{1y} \tag{2}$$

Next, the control unit 100 drives the carriage having the ]-shaped cross-section to integrally move the mask holder 12 and the plate holder 14 in a direction opposite to the direction of the arrow A up to a position at which the alignment marks M2 on the plate 22 and the marks M1 on the mask 20 are located within the fields of the alignment optical systems 28A, 28B through the projection optical systems 16A, 16C respectively. At this time, the optical filter unit 34 is switched to use the first optical filter 34A for the alignment light beam so that the resist on the plate 22 is not photosensitive thereto. Accordingly, the alignment light beam emitted from the light source 32 is bent by the half mirror 38 so that the area including the mark M1 on the mask 20 is irradiated therewith, and the alignment mark M2 on the plate 22 is irradiated therewith through the projection optical system 16A. Images of the mark M1 and the alignment mark M2 are formed on the light-receiving plane of the CCD camera 42 through the objective lens 40. The same operation is also conducted in the other alignment apparatus principally comprising the alignment optical system 28B. Images of the mark M1 and the alignment mark M2 are formed on the light-receiving plane of the CCD camera 42 through the objective lens 40 in the same manner as described above.

Figure 5C:
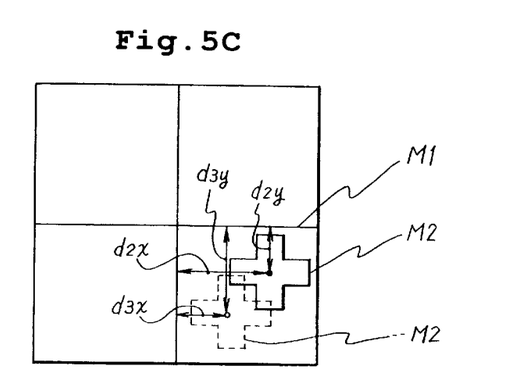
FIG. 5C shows an image obtained by monitoring images of the fiducial mark M1 and an alignment mark M2 illuminated with the alignment light beam by using a CCD camera.

FIG. 5C shows an example of an image projected on the monitor screen, comprising the images formed by the image formation on the light-receiving plane of the CCD camera 42 at this time. Image information corresponding to this image is sent to the image processing unit 36. The image processing unit 36 measures a discrepancy amount $(d_{2x}, d_{2y})$ between alignment marks M1 and M2.

However, the discrepancy amount $(d_{2x}, d_{2y})$ is a discrepancy amount between the alignment marks under the alignment light beam (alignment wavelength). Therefore, it is necessary to convert the discrepancy amount $(d_{2x}, d_{2y})$ into a discrepancy amount under the actual exposure light beam (exposure wavelength). For example, if it is assumed that the alignment mark M2 on the plate is seen under the exposure light beam at a position as shown by broken lines in FIG. 5C, the image processing unit 36 converts the discrepancy amount $(d_{2x}, d_{2y})$ into a discrepancy amount $(d_{3x}, d_{3y})$ under the exposure light beam by using the following expressions (3) and (4).

$$d_{3x} = d_{2x} + \Delta dx \quad (3)$$

$$d_{3y} = d_{2y} + \Delta dy \quad (4)$$

Next, the control unit 100 uses the discrepancy amount $(d_{3x}, d_{3y})$ determined on the basis of the expressions (3) and (4) as a final correction value so that the plate holder 14 is finely moved in the X, Y directions through an unillustrated driving system to perform alignment for the mask 20 and the plate 22.

After that, the control unit 100 retracts the alignment optical systems 28A, 28B to the outside of the illumination area of the illumination system 18. The light source 32 is turned OFF, and an exposure light source in the illumination system 18 is turned ON to start full-plate scanning exposure.

Specifically, the carriage having the ]-shaped cross-section is driven and moved up to a position at which right ends of the mask 20 and the plate 22 in FIG. 1 substantially coincide with left ends of the projection optical systems 16A to 16C, and then the carriage is stopped. After that, the carriage is driven and moved at a predetermined scanning speed along the direction of the X axis in the direction shown in the arrow A. Accordingly, the pattern on the mask 20 is successively transferred onto the plate 22 while being divided by the projection optical systems 16A to 16E. More specifically, the pattern image to be projected is transferred onto the plate 22 while being divided by the five projection optical systems 16A to 16E arranged in the so-called zigzag configuration as shown in FIG. 1 so that divided adjacent images slightly overlap with each other. In accordance with such a procedure, the carriage is moved up to a position at which a left end of the mask 20 substantially coincides with right ends of the projection optical systems 16D, 16E. Thus the entire pattern on the mask 20 is transferred onto the plate 22.

As explained above, according to this embodiment, it is unnecessary to provide any correcting optical system for correcting the aberration depending on the wavelength either within the projection optical system or within the alignment optical system. Therefore, in this embodiment, no error is generated which would be caused by such a correcting optical system. This embodiment includes the steps of radiating the alignment light beam and the exposure light beam through the projection optical system by switching the two light beams which have the same optical axis and which are generated from the same light source, measuring correlative discrepancy amounts between the fiducial marks generated at the two wavelengths respectively, previously calculating a difference between the correlative discrepancy amounts as an offset for correction, detecting a positional discrepancy between the plate 22 and the mask 20 under the alignment light beam upon alignment at an actual exposure position, and determining a correction amount for alignment on the basis of a result of the detection and the offset. Accordingly, the mask 20 and the plate 22 can be aligned precisely and accurately although the simple arrangement is used.

In the embodiment described above, it/is noted that the offset for correcting the influence of aberration of the projection optical system based on the difference in wavelength characteristic can be calculated by detecting only the fiducial marks on the first and second fiducial plates 24, 26. Accordingly, it is also possible to previously determine the offset to store in the memory without placing the mask on the mask holder.

The aforementioned embodiment has explained as an example comprising the steps of providing the first fiducial mark M1 on the mask 20 or the mask plate 12 in addition to the second fiducial mark M2 on the plate holder 14, simultaneously picking up images of these marks by using the CCD camera 42 under the exposure and alignment light beams, detecting correlative positional discrepancy amounts between the marks M1 and M2 under the exposure and alignment light beams respectively, using a difference between the correlative positional discrepancy amounts as an offset, detecting a positional discrepancy amount between the mark M1 and the alignment mark M2 on the plate 22 under the alignment light beam to detect a positional discrepancy between the mask 20 and the plate 22, and determining a final correction amount for alignment on the basis of a result of the detection and the offset. However, the present invention is not limited thereto. Namely, it is unnecessary for alignment for the plate 22 to always provide the mark M1 on the mask provided that the objective lens 40 for constituting the alignment optical system is made achromatic (corrected for chromatic aberration) for at least d-ray to h-ray. Accordingly, an alternative embodiment may comprise the steps of picking up images of the fiducial mark M2 on the plate by using the CCD camera 42 through the projection optical system under the exposure and alignment light beams, detecting positions of the mark M2 (XY coordinate values of the mark center) under the exposure and alignment light beams respectively, using an error between the positions as an offset, detecting a position of the alignment mark M2 on the plate 22 under the alignment light beam to detect a position of the plate 22, and determining a final correction amount for a positional discrepancy of the plate 22 on the basis of a result of the detection and the offset.

The aforementioned embodiment has explained as an example in which the first and second illuminating means are constructed by the identical means comprising the light source 32, the optical filter unit 32, and the half mirror 38. However, the present invention is not limited thereto. The first and second illuminating means may be different or separate means provided that the means use a common optical axis for an alignment light beam and a light beam having an exposure wavelength for alignment so that the two light beams are radiated through the identical projection optical system onto the area including the fiducial mark M2 on the second fiducial plate 26 or the alignment mark on the plate 22.

The aforementioned embodiment has explained as an example in which the first detecting means for detecting a mark position (or positional discrepancy) under the light beam having the exposure wavelength and the second detecting means for detecting a mark position (or positional discrepancy) under the alignment wavelength are constructed by the identical alignment optical system. However, such construction is provided for the purpose of simplification of the arrangement of the apparatus, and hence the present invention is not limited thereto. The first and second detecting means may be embodied separately as illustrated in the following modified embodiment.

<Modified Embodiment>

Figure 6:
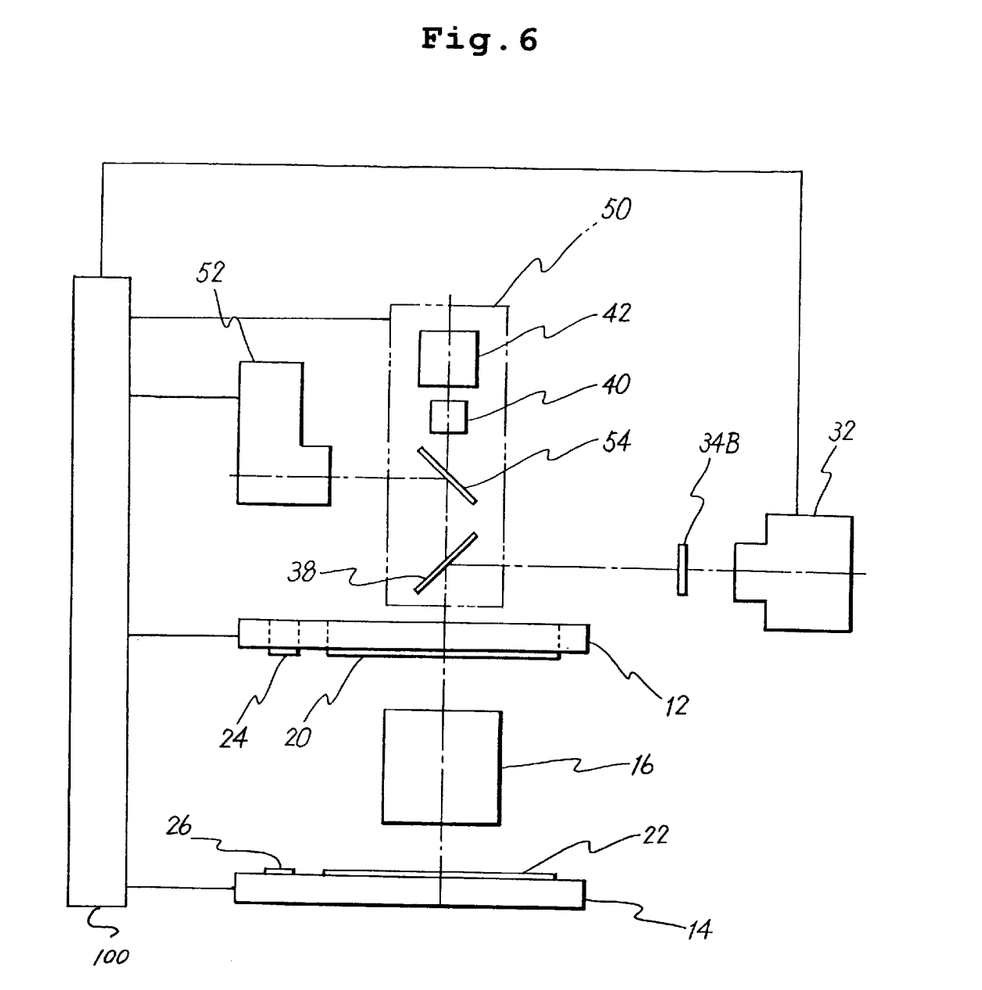
FIG. 6 shows an arrangement of a modified example of the alignment apparatus shown in FIG. 2.

FIG. 6 shows a modified embodiment of the alignment apparatus 30 included in the embodiment described above. The alignment apparatus of this modified embodiment includes an alignment optical system 50 as a first detecting means similar to the alignment optical system 28A described above, but the alignment apparatus further comprises a known laser scanning type alignment optical system (LSA) 52 as a second detecting means. The alignment optical system 50 includes a half mirror 54 between the objective lens 40 and the half mirror 38. A second optical filter 34B is provided on the optical axis of the light source 32.

Figure 7A:
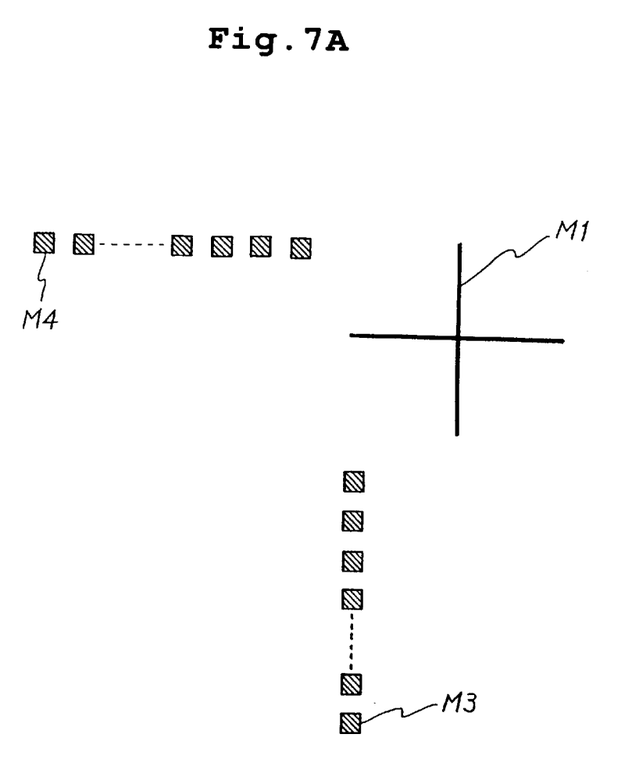
FIG. 7A shows a plan view illustrating a first fiducial mark M1 and mask marks M3, M4 for laser scanning formed on a first fiducial plate.
Figure 7B:
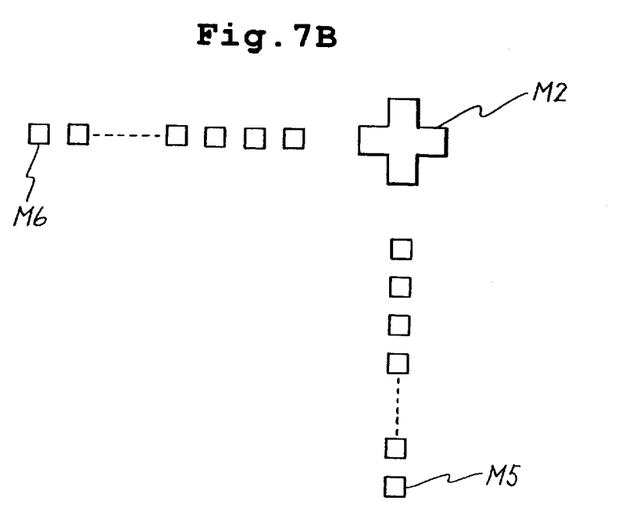
FIG. 7B shows a plan view illustrating a second fiducial mark M2 and mask marks M5,M6 for laser scanning formed on a second fiducial plate.

In this modified embodiment, as shown in FIG. 7A, the first fiducial plate 24 includes mask marks M4 for laser scanning for the X axis and mask marks M3 for laser scanning for the Y axis formed thereon as illustrated by hatched rectangles, in addition to the first fiducial mark M1 described above. The mark represented by the hatched rectangle is formed by coating with a material having opaque characteristics, such a metal, on a substrate such as glass. As shown in FIG. 7B, the second fiducial plate 26 also includes plate marks M6 for laser scanning for the X axis and plate marks M5 for laser scanning for the Y axis formed thereon as illustrated by blanked rectangles, in addition to the second fiducial mark M2 described above. The mark represented by the blanked rectangle is formed on a background which is coated with a material having opaque characteristics, such as a metal, on a substrate such as glass, wherein the mark represented by the blanked rectangle corresponds to an area which is free of the opaque material. The mask 20 includes only the mask marks M3, M4 for laser scanning formed thereon, while the plate 22 includes only the plate marks M5, M6 for laser scanning formed thereon.

According to this modified embodiment, a discrepancy between the first fiducial mark M1 and the second fiducial mark M2 is firstly detected under the exposure light beam by using the image processing unit 36 described above. Next, a discrepancy between the plate marks M5, M6 for laser scanning and the mask marks M3, M4 for laser scanning is detected by using the laser scanning type alignment optical system 52. A correction value ($\Delta dx$, $\Delta dy$) for the use of the alignment light beam instead of the exposure light beam is calculated on the basis of the discrepancies by using the expressions (1) and (2). The correction value ($\Delta dx$, $\Delta dy$) is stored as an offset value in the memory. Upon actual alignment during exposure to be performed thereafter, only the laser scanning type alignment optical system 52 is used to detect a discrepancy between the alignment marks M3, M4 and M5, M6. Thus alignment is performed on the basis of the discrepancy and the offset value described above.

As explained above, according to the present invention, an excellent effect, which has not been achieved by the conventional art, is obtained in that the TTL system can be used to realize alignment for a photosensitive substrate at high accuracy without using any optical system for correcting the aberration depending on the wavelength (correcting optical system for the alignment light beam) in the projection optical system.

In the embodiment and its modified embodiment described above, the projection exposure apparatus, the alignment method, and the projection exposure method of the present invention have been specifically explained. However, modifications and improvements thereof conceivable by so-called those skilled in the art are included in the scope of the present invention. For example, the fiducial mark or the like formed on the fiducial plate or the wafer has been detected by using reflected light, however, the detection is not limited thereto. Alternatively, the fiducial mark or the like may be detected in a form of various types of optical information such as diffracted light and transmitted light. In the embodiments described above, the CCD camera has been used as a detecting unit for optical information. However, there is no limitation thereto. Alternatively, a certain detecting unit such as various types of sensors may be used.

The aforementioned embodiments have explained as examples in which the present invention is applied to the full-plate scanning type exposure apparatus for liquid crystal devices for producing liquid crystal substrates. However, it is needless to say that the applicable range of the present invention is not limited thereto. The present invention can be also applied to other projection exposure apparatuses including, for example, reduction projection type exposure apparatuses of the step-and-repeat system (stepper), reduction projection type exposure apparatuses of the step-and-scan system, and equivalent magnification type exposure apparatuses. The present invention also undergoes no limitation for its use or application to liquid crystal substrates, which is applicable to various fields to use the technology of lithography, including, for example, fields of substrates for semiconductor circuits and substrates for thin film magnetic heads.

The present invention may be practiced or embodied in other various forms without departing from the spirit or essential characteristics thereof. It will be understood that the scope of the present invention is indicated by the appended claims, and all variations and modifications which come within the equivalent range of the claims are embraced in the scope of the present invention.

What is claimed is:

1. An exposure method for transferring a pattern formed on a mask onto a photosensitive substrate through a projection optical system, comprising:

a first step of radiating a light beam having a first wavelength characteristic through the projection optical system on a fiducial mark area including a fiducial mark installed at the same position as that of the photosensitive substrate in a direction of an optical axis of the projection optical system, and detecting optical information from the fiducial mark area to obtain a position of the fiducial mark under the light beam having the first wavelength characteristic;

a second step of radiating a light beam having a second wavelength characteristic different from the first wavelength characteristic through the projection optical system onto the fiducial mark area, and detecting optical information from the fiducial mark area to obtain a position of the fiducial mark under the light beam having the second wavelength characteristic;

a third step of determining a positional discrepancy of the fiducial mark caused by imaging errors of the projection optical system resulted from the difference in wavelength between the light beam having the first wavelength characteristic and the light beam having the second wavelength characteristic on the basis of results of the detection in the first and second steps;

a fourth step of radiating the light beam having the second wavelength characteristic through the projection optical system onto a substrate mark area including an alignment mark on the photosensitive substrate, and detecting optical information from the substrate mark area to obtain a position of the photosensitive substrate under the light beam having the second wavelength characteristic; and a fifth step of correcting a positional discrepancy of the photosensitive substrate on the basis of a result of the detection in the fourth step and a result of the third step.

2. The exposure method according to claim 1, wherein the light beam having the first wavelength characteristic is a light beam having a wavelength with which the photosensitive substrate is exposed.

3. The exposure method according to claim 1, wherein the fiducial mark area including the fiducial mark is formed on a fiducial plate installed on a substrate stage on which the photosensitive substrate is placed.

4. The projection exposure method according to claim 1, wherein the method is a scanning type projection exposure method for producing substrates for liquid crystal devices.

5. An exposure method for transferring a pattern formed on a mask onto a photosensitive substrate through a projection optical system, comprising:

a first step of radiating a light beam having a first wavelength characteristic onto a first fiducial member formed on a mask holder for holding the mask thereon, radiating the light beam having the first wavelength characteristic through the projection optical system onto a second fiducial member installed at the same position as that of the photosensitive substrate in the direction of the optical axis of the projection optical system and corresponding to the first fiducial member, and detecting optical information from the first and second fiducial members to obtain a positional relationship between the first and second fiducial members under the light beam having the first wavelength characteristic;

a second step of radiating a light beam having a second wavelength characteristic different from the first wavelength characteristic onto the first fiducial member, radiating the light beam having the second wavelength characteristic through the projection optical system onto the second fiducial member, and detecting optical information from the first and second fiducial members to obtain a positional relationship between the first and second fiducial members under the light beam having the second wavelength characteristic;

a third step of determining a difference between the positional relationships caused by the difference in wavelength between the light beam having the first wavelength characteristic and the light beam having the second wavelength characteristic on the basis of results of the detection in the first and second steps.

6. The exposure method according to claim 5, wherein the light beam having the first wavelength characteristic is a light beam having a wavelength with which the photosensitive substrate is exposed.

7. The exposure method according to claim 5, wherein the second fiducial member is formed on a substrate stage on which the photosensitive substrate is placed.

8. A projection exposure apparatus for transferring a pattern formed on a mask onto a photosensitive substrate, comprising:

a projection optical system, disposed between the mask and the photosensitive substrate, that projects an image of a pattern of the mask onto the photosensitive substrate;

a mask stage for placing the mask thereon;

a photosensitive substrate stage, provided with a fiducial plate, for placing the photosensitive substrate thereon;

a first energy source that radiates a light beam having a first wavelength characteristic and a light beam having a second wavelength characteristic different from the first wavelength characteristic through the projection optical system onto a first mark area including a fiducial mark formed on the fiducial plate;

a first detector that detects optical information from the first mark area to obtain a position of the fiducial mark under the light beam having the first wavelength characteristic;

a second detector that detects optical information from the first mark area to obtain a position of the fiducial mark under the light beam having the second wavelength characteristic; and a calculator that calculates a positional discrepancy of the fiducial mark caused by imaging errors of the projection optical system resulted from the difference in wavelength between the light beam having the first wavelength characteristic and the light beam having the second wavelength characteristic on the basis of results of the detection by the first and second detectors;

whereby positional alignment for the photosensitive substrate is performed prior to actual exposure on the basis of the positional discrepancy calculated by the calculator.

9. The projection exposure apparatus according to claim 8, wherein the first and second detectors are a single detector which is capable of detecting the position of the fiducial mark under the light beam having the first wavelength characteristic and under the light beam having the second wavelength characteristic.

10. The projection exposure apparatus according to claim 8, wherein the first energy source comprises a light source, and a wavelength selector that selectively transmits a light beam from the light source depending on its wavelength characteristic, selectively radiates the light beam having one of the first and second wavelength characteristic onto the mask stage or the mask, and selectively radiates the light beam having one of the first and second wavelength characteristic through the projection optical system onto the substrate stage.

11. The projection exposure apparatus according to claim 8, wherein the apparatus is a scanning type projection exposure apparatus which provides a synchronized movement of the mask with the photosensitive substrate to expose the image of the pattern of the mask onto the photosensitive substrate.

12. The projection exposure apparatus according to claim 8, wherein the apparatus is a step-and-scan type projection exposure apparatus that successively exposes the photosensitive substrate with the mask pattern by scanning the mask and the photosensitive substrate in synchronization with respect to an illumination area comparted in a form of a slit.

13. The projection exposure apparatus according to claim 8, wherein one of the first and second wavelength is a wavelength for exposure.

14. A projection exposure apparatus for transferring a pattern formed on a mask onto a photosensitive substrate, comprising:

a projection optical system, disposed between the mask and the photosensitive substrate, that projects an image of a pattern of the mask onto the photosensitive substrate;

a mask stage, provided with a first fiducial member, for placing the mask thereon;

a photosensitive substrate stage, provided with a second fiducial member, for placing the photosensitive substrate thereon;

a first energy source that radiates a light beam having a first wavelength characteristic onto a first fiducial member, and radiates the light beam having the first wavelength characteristic through the projection optical system onto the second fiducial member;

a first detector that detects optical information from the first and second fiducial members to obtain a correlative positional discrepancy between the first and second fiducial members under the light beam having the first wavelength characteristic;

a second energy source that radiates a light beam having a second wavelength characteristic different from the first wavelength characteristic onto the first fiducial member, and radiates the light beam having the second wavelength characteristic through the projection optical system onto the second fiducial member;

a second detector that detects optical information from the first and second fiducial members to obtain a correlative positional discrepancy between the first and second fiducial members under the light beam having the second wavelength characteristic; and a calculator that calculates a difference between the positional discrepancies caused by the difference in wavelength between the light beam having the first wavelength characteristic and the light beam having the second wavelength characteristic on the basis of results of the detection by the first and second detectors.

15. The projection exposure apparatus according to claim 14, wherein the first and second detectors are a single detector which is capable of detecting positions of the fiducial members under the light beam having the first wavelength characteristic and under the light beam having the second wavelength characteristic.

16. The projection exposure apparatus according to claims 14, wherein the first and second energy sources are a single device comprising a light source, and a wavelength selector that selectively transmits a light beam from the light source depending on its wavelength characteristic, selectively radiates the light beam having one of the first and second wavelength characteristic onto the mask stage, and selectively radiates the light beam having one of the first and second wavelength characteristic through the projection optical system onto the substrate stage.

17. The projection exposure apparatus according to claim 14, wherein the apparatus is a scanning type projection exposure apparatus which provides a synchronized movement of the mask with the photosensitive substrate to expose the image of the pattern of the mask onto the photosensitive substrate.

18. The projection exposure apparatus according to claim 14, wherein the apparatus is a step-and-scan type projection exposure apparatus that successively exposes the photosensitive substrate with the mask pattern by scanning the mask and the photosensitive substrate in synchronization with respect to an illumination area comparted in a form of a slit.

19. The projection exposure apparatus according to claim 14, wherein one of the first and second energy sources radiates a light beam having a wavelength for exposure.

20. The exposure method according to claim 5, wherein the light beam having the first wavelength characteristic and the light beam having the second wavelength characteristic are illuminated onto an identical mark formed on the first fiducial member.

21. The exposure method according to claim 5, wherein the light beam having the first wavelength characteristic and the light beam having the second wavelength characteristic are illuminated onto an identical mark formed on the second fiducial member.

22. The projection exposure apparatus according to claim 11, wherein the projection optical system has a plurality of projection optical units arranged in a direction perpendicular to a direction of the synchronized movement.

23. The projection exposure apparatus according to claim 22, wherein the first energy source illuminates through two projection optical units each disposed at a respective end of the projection optical system.

24. The exposure apparatus according to claim 14, wherein the light beam having the first wavelength characteristic and the light beam having the second wavelength characteristic are illuminated onto an identical mark formed on the first fiducial member.

25. The exposure apparatus according to claim 14, wherein the light beam having the first wavelength characteristic and the light beam having the second wavelength characteristic are illuminated onto an identical mark formed on the second fiducial member.

26. The projection exposure apparatus according to claim 17, wherein the first and second energy sources illuminate through two projection optical units each disposed at a respective end of the projection optical system.

27. A method for making an exposure apparatus which exposes a substrate with a pattern formed on a mask, comprising:

providing a projection optical system between the mask and the substrate, the projection optical system projecting an image of the pattern of the mask onto the substrate;

providing a mask stage which holds the mask thereon;

providing a substrate stage which holds the substrate thereon and comprises a first fiducial mark;

providing an energy source that radiates a light beam having a first wavelength characteristic and a light beam having a second wavelength characteristic through the projection optical system onto the first fiducial mark;

providing a detector that detects optical information from the first fiducial mark to obtain positions thereof by using the light beam having the first wavelength characteristic and the light beam having the second wavelength characteristic, respectively; and providing a calculator that calculates a positional discrepancy caused by the difference in wavelength between the light beam having the first wavelength characteristic and the light beam having the second wavelength characteristic on the basis of results of the detection by the detector.

28. The method according to claim 27, wherein the energy source illuminates a mask-fiducial mark formed on the mask stage.

29. The method according to claim 27, wherein the light beam having the first wavelength characteristic and the light beam having the second wavelength characteristic are illuminated onto an identical fiducial mark formed on the substrate stage.

* * * * *